United States Patent [19]
Denedios

[11] Patent Number: 6,078,662
[45] Date of Patent: Jun. 20, 2000

[54] RADIO FREQUENCY INTERFERENCE FILTER

[76] Inventor: Tom Denedios, P.O. Box 1330, Fort Pierce, Fla. 34979

[21] Appl. No.: 08/244,286

[22] PCT Filed: Sep. 27, 1993

[86] PCT No.: PCT/US93/09047

§ 371 Date: May 23, 1994

§ 102(e) Date: May 23, 1994

[87] PCT Pub. No.: WO94/08417

PCT Pub. Date: Apr. 14, 1994

Related U.S. Application Data

[63] Continuation of application No. 07/951,396, Sep. 25, 1992, abandoned.

[51] Int. Cl.[7] ........................................... H04M 1/74
[52] U.S. Cl. ................................. 379/416; 333/12
[58] Field of Search .................... 379/413, 414, 379/415, 416, 417; 333/12, 25, 167, 176, 177, 178, 179, 180, 181, 182, 185, 186, 194

[56] References Cited

U.S. PATENT DOCUMENTS

| | | |
|---|---|---|
| 2,144,950 | 1/1939 | Weissner . |
| 2,297,215 | 9/1942 | Hagen . |
| 2,362,549 | 11/1944 | Hale . |
| 2,621,252 | 12/1952 | Pontius . |
| 3,987,380 | 10/1976 | Hudson, Jr. .............................. 333/181 |
| 4,751,607 | 6/1988 | Smith .................................. 379/416 X |
| 4,779,068 | 10/1988 | Sakamoto et al. .................. 379/415 X |
| 5,077,543 | 12/1991 | Carlile ..................................... 333/177 |
| 5,200,718 | 4/1993 | Kato ......................................... 333/25 |

*Primary Examiner*—Scott L. Weaver
*Attorney, Agent, or Firm*—Sonnenschein Nath & Rosenthal

[57] ABSTRACT

A Radio Frequency Interference Filter (10, 12) is connectable in series in the tip (T) and ring (R) branches of a telephone circuit. A first suppression stage (20) has a first inductor (L1) connectable to the tip (T) branch of the circuit and a second inductor (L2) connectable to the ring (R) branch of the circuit. The second suppression stage (22) of one embodiment of the filter (10) has a transformer (T1) with one winding (W1) connected in series with the first inductor (L1) for the tip (T) branch of circuitry and the second winding (W2) connected in series with the second inductor (L2) for the ring (R) branch of circuitry. In a second, alternative embodiment of the filter 12, the second suppression stage (22) has one ferrite-core inductor (L3) connected in series with the first inductor (L1) for the tip (T) branch of circuitry and a second ferrite-core inductor (L4) connected in series with the second inductor (L2) for the ring (R) branch of circuitry. A fuse (F1, F2) may precede each inductor (L1, L2) to protect the filter (10). The filter (10, 12) may be encapsulated to provide protection from adverse environmental changes.

5 Claims, 1 Drawing Sheet

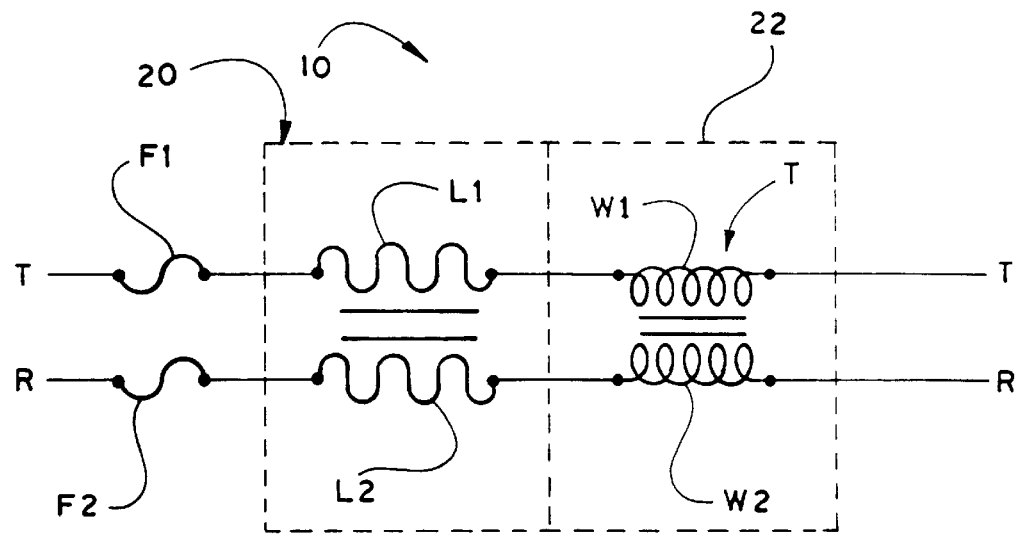
Fig_1
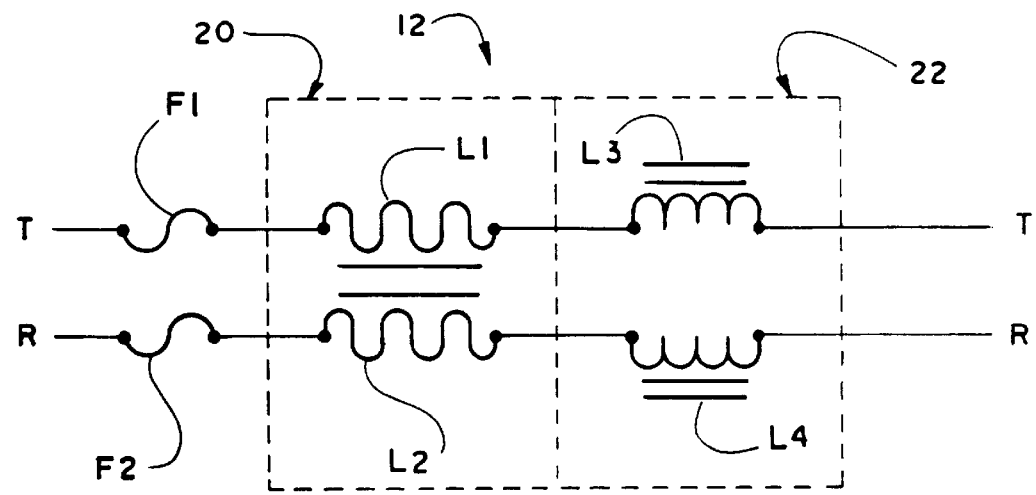
Fig_2

RADIO FREQUENCY INTERFERENCE FILTER

This is a continuation of application Ser. No. 07/951,396, filed Sep. 25, 1992, now abandoned.

TECHNICAL FIELD OF THE INVENTION

The present invention relates to a Radio Frequency Interference (RFI) filter for a telecommunications device, and more particularly to an RFI filter for telephone equipment that suppresses frequencies in the range from about 450 kHz to about 150 MHz.

BACKGROUND OF THE INVENTION

Electromagnetic interference in the so-called radio frequency range is commonly referred to as Radio Frequency Interference (RFI). RFI can occur in a telecommunications network whose wiring is subject to strong radio frequency electrical fields. RFI is a problem in telecommunications because it impairs reception of the signal transmitted through the telecommunications network. Impairment of a transmitted signal is particularly undesirable in the transmission of voice frequency signals because of the need for a telephone subscriber to receive clear, accurate voice communications.

SUMMARY OF THE INVENTION

It is an object of the present invention to provide a means for suppressing RFI in voice frequency loops of telecommunication circuitry.

It is a further object of the invention to provide such suppression of RFI in the range of 450 kHz to 150 MHz.

According to the invention, each of a pair of inductors has a lead connectable respectively to tip and ring leads of the telephone circuitry. The second lead of each inductor is connected to a respective coil of a transformer. To complete the tip and ring series circuits, the free lead of each coil of the transformer is connectable to respective tip and ring leads. The pair of inductors form a first stage of filtering while the transformer provides a second stage of filtering. In an alternative embodiment, each of a pair of inductors has a lead connectable respectively to tip and ring leads of the telephone circuitry. The second lead of each inductor is connected to a ferrite-core inductor. To complete the tip and ring series circuits, the free lead of each ferrite-core inductor is connectable to respective tip and ring leads. The pair of inductors form a first stage of filtering while the ferrite-core inductors provide the second stage of filtering. Each device provides suppression of RFI from 450 kHz to 150 MHz. A fuse may precede each inductor to protect the device from power surges and the like.

Other aspects, objects, features, and advantages of the present invention will become apparent to those skilled in the art upon reading the detailed description of preferred embodiments.

BRIEF DESCRIPTION OF THE DRAWINGS

FIG. 1 is a schematic diagram of an RFI filter in accordance with a preferred embodiment the invention.

FIG. 2 is a schematic diagram of an RFI filter in accordance with a second preferred embodiment of the invention.

DETAILED DESCRIPTION OF PREFERRED EMBODIMENTS OF THE INVENTION

While the specification concludes with claims particularly pointing out and distinctly claiming the subject matter which is regarded as the present invention, the invention will now be described with reference to the following description of an embodiment taken in conjunction with the accompanying drawing. Referring to FIG. 1, there is shown a schematic diagram of an RFI filter 10 in accordance with a preferred embodiment of the invention. The filter 10 has a first stage 20 for suppressing lower frequencies of RFI and a second stage 22 for suppressing higher frequencies of RFI. The filter 10 is insertable in series in the tip T and ring R conductors of telephone circuitry. A first inductor L1 and a second inductor L2 form the first suppression stage 20. The first inductor L1 is connectable in the tip T branch of circuitry while the second inductor L2 is connectable in the ring R branch of circuitry. In the second suppression stage 22, a transformer is connected in series in the tip T and ring R circuitry. A first winding W1 of the transformer T1 is connected in series in the tip T branch of circuitry, following the first inductor L1. The second winding W2 of the transformer T1 is connected in series in the ring R branch of circuitry, following the second inductor L2.

In a second preferred embodiment of the invention, an RFI filter 12 also has a first stage 20 for suppressing lower frequencies of RFI and a second stage 22 for suppressing higher frequencies of RFI. The filters 10, 12 differ in only one aspect. The filter 12 of the alternative preferred embodiment has a pair of ferrite-core inductors L3, L4 rather than a transformer T1 serving as the second suppression stage 22. As with the filter 10 described above, in the alternative filter 12 a first inductor L1 and a second inductor L2 form the first suppression stage 20. Each ferrite-core inductor L3, L4 is connected in series with a respective first-stage 20 inductor L1, L2. A suitable type of ferrite-core inductor is part number 28C0236-OBW sold by the Steward company of Chattanooga, Tenn., United States of America. The Steward inductor's core is generally believed to be of a nickel-zinc-iron silicide material. Steward part number 28C0236-OBW is a 6-hole cylinder type of core having two and one-half ($2\frac{1}{2}$) turns.

The first stage 20 suppresses RFI in the range of 450 kHz to 10 MHz. The second stage 22 suppresses RFI in the range of 10 MHz to 150 MHz. The filter 10, 12 is balanced. The tip T and ring R outputs of circuitry containing the filter 10, 12 are balanced. The filter 10, 12 attenuates both the tip T and ring R branches of circuitry simultaneously. The filter 10, 12 works well to suppress RFI in voice-frequency loops. A separate ground connection is not required to install the device.

It is significant that neither filter 10, 12 requires a ground connection to perform RFI filtering. It is important that the devices 10, 12 do not require grounding because a ground connection may not be readily available at a point of desired installation. This is particularly true when it is desirable to install the device 10, 12 near the user interface of a telephone system because traditionally plumbing in a telephone subscriber's business or residence has been used as the point of ground connection. In modern-day construction, many plumbing lines and some fixtures are made of non-conductive materials such as PVC rather than the metals that were previously used.

The filter 10, 12 may be inserted at any point in the telephone circuitry but works well when inserted close to or at the subscriber interface of the telephone system circuitry. When the filter 10, 12 is installed closest to the customer interface, for example, at the protector to the demodulation circuitry, suppression of RFI preceding the subscriber equipment is possible. The filter 10, 12 reduces the level of longitudinally conducted RFI present at a telephone subscriber network interface when the network wiring is subject to strong radio frequency electrical fields.

A fuse F1, F2 may respectively precede each inductor L1, L2 to provide protection from power surges or overloads. The device may be encapsulated or otherwise enclosed so that it is useful under various environmental conditions.

While the specification concludes with claims particularly pointing out and distinctly claiming the subject matter which is regarded as the present invention, the invention will now be described with reference to the following description of embodiments taken in conjunction with the accompanying drawings.

What is claimed is:

1. A method of suppressing longitudinally-conducted radio frequency interference in voice frequency loops having two circuit branches consisting of inserting in series in each of the branches a first inductor coupled with a second ferrite-core inductor.

2. A filter for suppressing longitudinally-conducted radio frequency interference in voice frequency loops consisting of:

a first inductor;

a second inductor; and a transformer having a first winding and a second winding;

wherein said first inductor and said first winding of said transformer are coupled in series and said second inductor and said second winding of said transformer are couple, in series.

3. In a telephone line circuit having a tip branch of circuitry and a ring branch of circuitry an improvement consisting of:

a first inductor;

a second inductor; and a transformer having a first winding and a second winding;

wherein said first inductor and said first winding of said transformer are coupled in series and connected in series in the tip branch of circuitry and said second inductor and said second winding of said transformer are coupled in series and connected in series in the ring branch of circuitry.

4. A filter for suppressing longitudinally-conducted radio frequency interference in voice frequency loops consisting of:

a first inductor;

a second inductor;

a first ferrite-core inductor; and a second ferrite-core inductor;

wherein said first inductor and said first ferrite-core inductor are coupled in series and said second inducts and said second ferrite-core inductor are coupled in series.

5. In a telephone line circuit having a tip branch of circuitry and a ring branch of circuitry an improvement consisting of:

a first inductor;

a second inductor;

a first ferrite-core inductor; and a second ferrite-core inductor;

wherein said first inductor and said first ferrite-core inductor are coupled in series and connected in series to the tip branch of circuitry, and said second inductor and said second ferrite-core inductor are coupled in series and connected in series to the ring branch of circuitry.

* * * * *